(12) United States Patent
Yin et al.

(10) Patent No.: US 6,790,762 B1
(45) Date of Patent: Sep. 14, 2004

(54) METHOD OF MAKING AN ELECTRICAL DEVICE INCLUDING AN INTERCONNECT STRUCTURE

(75) Inventors: Zhiping Yin, Boise, ID (US); Mark Jost, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/651,386

(22) Filed: Aug. 29, 2000

Related U.S. Application Data

(63) Continuation of application No. 09/143,289, filed on Aug. 28, 1998, now Pat. No. 6,150,257.

(51) Int. Cl.$^7$ .......................................... H01L 21/4763
(52) U.S. Cl. ..................... 438/622; 438/627; 438/643; 438/648; 438/775
(58) Field of Search ................................ 438/622, 627, 438/643, 648, 653, 659, 660, 775

(56) References Cited

U.S. PATENT DOCUMENTS

| | | | |
|---|---|---|---|
| 5,405,492 A | 4/1995 | Moslehi .................... 156/643 |
| 5,529,954 A | 6/1996 | Iijima et al. ................ 438/653 |
| 5,592,024 A | 1/1997 | Aoyama et al. ............ 257/751 |
| 5,633,200 A | 5/1997 | Hu ............................. 438/653 |
| 5,659,201 A | 8/1997 | Wollesen .................... 257/758 |
| 5,780,908 A | 7/1998 | Sekiguchi et al. .......... 257/383 |
| 5,861,675 A | 1/1999 | Sasaki et al. ............... 257/764 |
| 5,876,788 A | * | 3/1999 | Bronner et al. .............. 427/81 |
| 6,077,774 A | * | 6/2000 | Hong et al. ................. 438/643 |
| 6,114,238 A | 9/2000 | Liao ........................... 438/648 |
| 6,184,124 B1 | * | 2/2001 | Hasegawa et al. .......... 438/625 |

FOREIGN PATENT DOCUMENTS

JP    6-140397    5/1994

* cited by examiner

Primary Examiner—T. N. Quach
(74) Attorney, Agent, or Firm—Workman Nydegger

(57) ABSTRACT

As an alternative embodiment and in connection with the reduction of the amount of ammonia in the mixture, processing conditions may be altered from conditions that are less likely to cause formation to oxide husk 20 to conditions that are more likely. For example, processing temperatures sufficient to form passivation layer 32 may be initiated with an ammonia-rich mixture under conditions not likely to cause formation of oxide husk 20. As the amount of ammonia in the mixture is reduced, processing temperatures may be increased proportionally under conditions that are more likely to cause formation of oxide husk 20 than under conditions previously established when the amount of ammonia in the mixture is greater. The initial formation of some of passivation layer 32, however, resists the formation of oxide husk 20. Preferably, the processing temperature will be the same as the deposition temperature for ILD layer 18.

27 Claims, 3 Drawing Sheets

US 6,790,762 B1

METHOD OF MAKING AN ELECTRICAL DEVICE INCLUDING AN INTERCONNECT STRUCTURE

RELATED APPLICATIONS

This is a continuation of U.S. patent application Ser. No. 09/143,289, filed on Aug. 28, 1998, now U.S. Pat. No. 6,150,257, titled "Plasma Treatment of an Interconnect Surface During Formation of an Interlayer Dielectric," which is incorporated herein by reference.

BACKGROUND OF THE INVENTION

1. The Field of the Invention

The present invention relates to semiconductor chip processing. More particularly, the present invention relates to formation of interlayer dielectrics that cover electrically conductive interconnects. In particular, the present invention relates to a method of resisting oxidation from the top surface of an electrically conductive interconnect during the formation of an interlayer dielectric.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

Semiconductor chip processing technology involves miniaturizing a plurality of semiconductive devices and placing them side-by-side upon a wafer. As miniaturization technology progresses, it has become expedient to stack semiconductive devices in order to retain a small chip footprint. It is also necessary to connect stacked devices by way of formation of an interconnect corridor and by filling of the interconnect corridor with electrically conductive material such as a tungsten stud. Metallization lines are formed that make electrical connection to the tungsten stud. These metallization lines need to be electrically isolated from semiconductive devices that are formed above an existing layer of semiconductive devices. To this end, an interlayer dielectric (ILD) such as an oxide or nitride is formed FIG. 1 is an elevational cross-section view of a semiconductor structure 10 that depicts interconnects 12 within a dielectric layer 14. Semiconductor structure 10 has an upper surface 16 upon which an interlayer dielectric (ILD) layer 18 has been formed. The left half of FIG. 1 depicts an initial effect of formation of ILD layer 18 according to the prior art. It can be seen that the portion of interconnect 12 that was exposed as part of upper surface 16 of semiconductor structure 10 has formed an oxide husk 20 upon interconnect 12. Oxide husk 20 is formed either after planarization to form upper surface 16, such as by chemical-mechanical planarization (CMP) or during the deposition of ILD layer 18. Where interconnect 12 is a tungsten plug, oxide husk 20 forms into tungsten oxide ($WO_3$).

Further processing of semiconductor structure 10, including thermal processing, causes complications that arise in the prior art. The right half of FIG. 1 depicts one prior art problem It can be seen that, due to a large stress between oxide husk 20 and interconnect 12, oxide husk 20 has delaminated from interconnect 12 due to adhesion failure, and pushed upwardly to form a void 22 immediately above interconnect 12. Void 22 causes planarity problems and can also lead to underetched trenches prior to metal fill. The delamination of oxide husk 20 is an indication of a relatively thick oxide over interconnect 12. The thickness of oxide husk can range from about 10 Å to about 500 Å. Oxide husk 20 needs to be removed prior to deposition of a metal line. The presence of void 22 causes a prominence in the ILD topology. The prominence can lead to underetched trenches prior to metal fill, resulting in the metal line not making sufficient electrical contact with interconnect 12. In addition, the prominence caused by the formation of void 22 can be formed during ILD deposition. Additionally, the prominence formed due to void 22 could cause some imaging problems because of a departure from substantial planarity of the upper surface of the ILD.

The delamination of oxide husk 20 from upper surface 16 immediately above interconnect 12 creates significant yield problems and device failure both during device testing and in the field.

What is needed in the art is a method of overcoming the prior art problems. What is also needed in the art is a method of forming an ILD layer without the formation of an oxide husk and the subsequent formation of a void between the top of the interconnect and the ILD layer. What is needed in the art is a method of preventing or reducing the oxidation of the upper surface of a metallic interconnect during the formation of an interlayer dielectric.

SUMMARY OF THE INVENTION

The present invention relates to the formation of an ILD layer while preventing or reducing oxidation of the upper surface of an electrically conductive interconnect or contact. Prevention or reduction of oxidation of the upper surface of an interconnect or contact is achieved according to the present invention by passivating the exposed upper surface of the interconnect or contact prior to formation of the ILD. It is to be understood that "interconnect" and "contact" can be interchangeable in the inventive method and structures.

In order to avoid the oxidation of an upper surface of an interconnect during the formation of an ILD layer, an in situ passivation of the upper surface of the interconnect, immediately prior to or simultaneously with the formation of the ILD layer, avoids the problems of the prior art.

A preferred embodiment of the present invention comprises providing a semiconductor structure including a dielectric layer. Following the formation of the dielectric layer, a depression is formed in the dielectric layer. The depression terminates at an electrically conductive structure therebeneath. The depression is then filled with an interconnect that is composed of an electrically conductive material, such as a refractory metal, and preferably tungsten. After filling of the depression with the interconnect, an upper surface of the interconnect and dielectric layer is formed by a method such as chemical-mechanical planarization (CMP).

Following the formation of the upper surface, a chemical composition is reacted with at least one monolayer of the upper surface of the interconnect to form a chemical compound having a higher resistance to oxidation than the interconnect.

Preferably, the chemical composition will be a nitrogen-containing chemical compound such as ammonia, $NH_3$. Where the interconnect is a refractory metal, such as tungsten, the at least one monolayer forms a tungsten nitride-type composition or adsorbed complex. Following formation of the at least one monolayer upon the upper surface of the interconnect, formation of the ILD layer may be carried out by such methods as a deposition by the decomposition of tetra ethyl ortho silicate (TEOS), or by chemical vapor deposition (CVD) of oxides, nitrides, carbides, and the like.

In order to form an ILD layer using lower processing temperatures, it is preferred that a CVD be carried out under plasma-enhanced (PE) conditions, i.e., PECVD.

Formation of the ILD layer may be carried out in a manner that introduces materials to form the ILD layer simultaneously with the introduction of the ammonia plasma to create a passivation layer upon the upper surface of the interconnect.

Next, formation of the ILD layer with substantially like materials is carried out under conditions where the ILD layer substantially absorbs the passivation layer and the passivation layer is sufficiently thick to resist substantial formation of the oxide husk.

Alternative compositions to ammonia may be used during plasma treatment of the upper surface of the interconnect. For example, nitrogen-containing compositions that are preferred for the inventive method include ammonia, diatomic nitrogen, nitrogen-containing silane, and the like.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to the formation of an ILD layer while preventing or reducing oxidation of the upper surface of an interconnect or contact stud. Prevention or reduction of oxidation of the upper surface of an interconnect is achieved according to the present invention by passivating the exposed upper surface of the interconnect prior to formation of the ILD.

Figure 1:
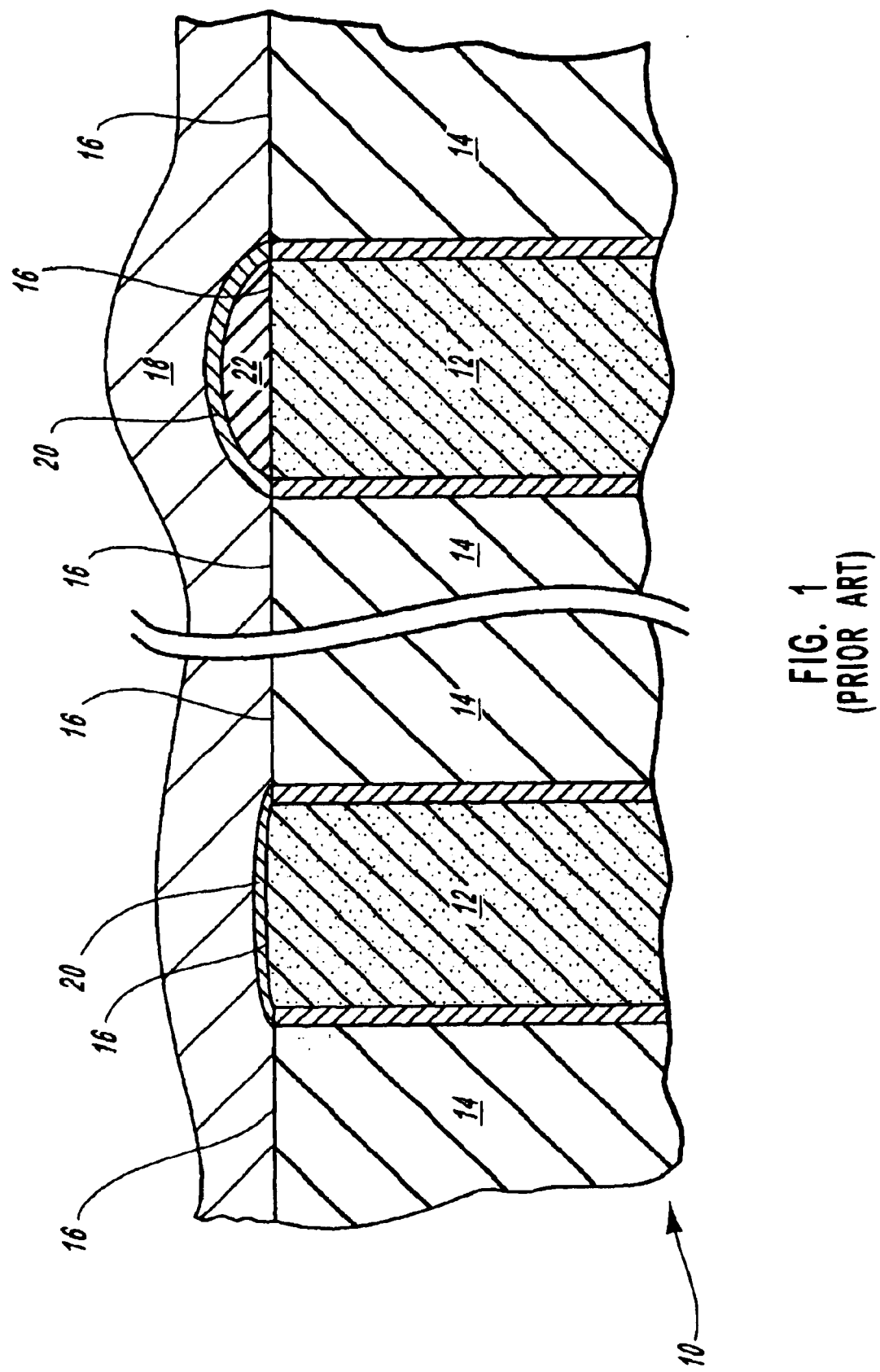
FIG. 1 is an elevational cross-section view of a semiconductor structure comprising a dielectric layer and a metallic interconnect according to the prior art. It can be seen in FIG. 1 that two stages of processing are illustrated, whereby an oxide husk upon the interconnect expands to create a void and a substantially non-planar topology for subsequently deposited layers.
Figure 2:
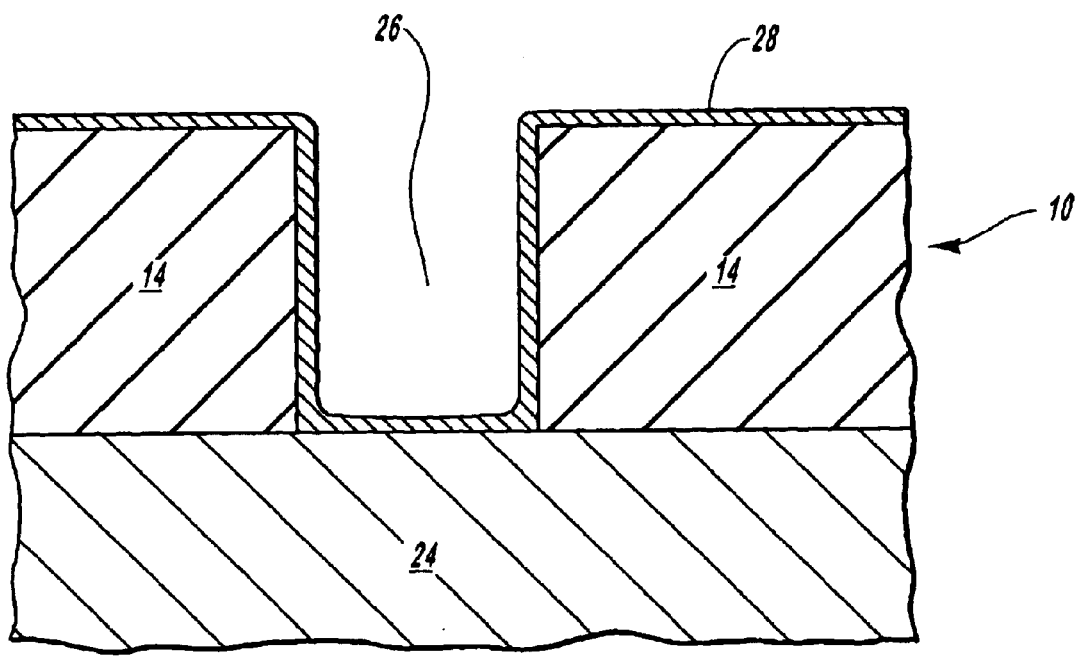
FIG. 2 is an elevational cross-section view of a semiconductor structure being manufactured according to the inventive method, where a contact corridor has been opened in a dielectric layer and a liner layer has been deposited upon the dielectric layer and within the contact corridor.

In reference to FIG. 2, prevention or reduction of the likelihood of oxidation of upper surface 16 of interconnect 12 is accomplished during the formation of ILD layer 18. This is carried out by an in situ passivation of upper surface 16 of interconnect 12, immediately prior to or simultaneously with the formation of ILD layer 18, which avoids the problems of the prior art.

Figure 3:
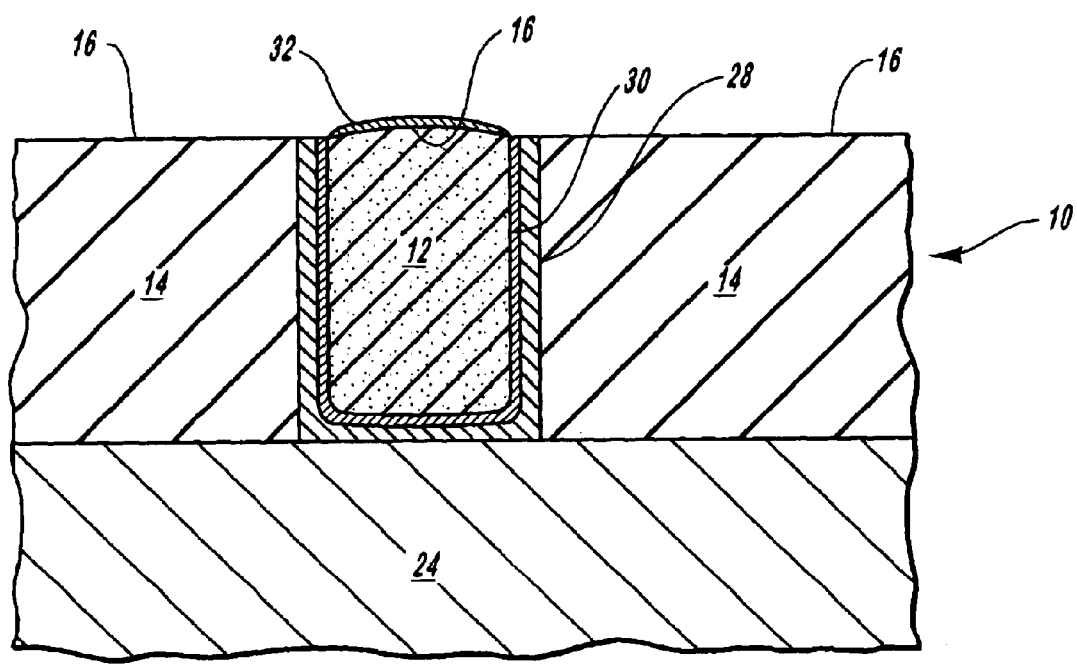
FIG. 3 is an elevational cross-section view of the semiconductor structure depicted in FIG. 2 after further processing, wherein a metal nitride layer has been formed upon the liner layer, an electrically conductive stud or interconnect has been filled into the depression, and wherein an upper surface has been created by a technique such as planarization. The upper surface includes both the dielectric layer and the interconnect, and wherein a passivation layer has been formed upon the upper surface.

A preferred embodiment of the present invention, illustrated beginning at FIG. 2, comprises providing semiconductor structure 10 consisting of dielectric layer 14. Following the formation of dielectric layer 14, a depression 26 is formed in dielectric layer 14 so as to terminate at an electrically conductive structure therebeneath such as a substrate 24. Depression 26 is then filled with an interconnect 12 as seen in FIG. 3, composed of an electrically conductive material such as a refractory metal. Interconnect 12 can be a tungsten stud or the like. After filling of depression 26 with an electrically conductive material, upper surface 16 of interconnect 12 and upper surface 16 of dielectric layer 14 is formed by a method such as CMP as illustrated in FIG. 3.

Following the formation of upper surface 16, a chemical composition is reacted with at least one monolayer of upper surface 16 of interconnect 12 to form a chemical compound having a higher resistance to oxidation than interconnect 12.

The chemical compound is provided in an amount sufficient to substantially chemically cover upper surface 16 of interconnect 12 in order to chemically protect approximately the first 1–1,000 atomic lattice layers thereof The chemical compound may be a nitride form of the metal of which interconnect 12 is composed. Where ammonia, a hydrated nitrogen compound or the like is used, a chemical structure such as M-N-Hx forms, where M represents the metal of which interconnect 12, is composed.

The chemical compound may be, by way of non-limiting example, the nitrogen-containing chemical compound such as ammonia that has been adsorbed onto upper surface 16 of interconnect 12 sufficiently to substantially chemically cover or "blind off" substantially any chemically reactive portion of upper surface 16 of interconnect 12 during formation of ILD layer 18. Use of preferred chemical compounds that are to be matched with specific materials comprising interconnect 12 can be selected by one of ordinary skill in the art using such data and equations as Langmuir's monolayer adsorption isotherm or those also taught by Brunauer, Emmett, or Teller. Of interest to selection of a particular chemical compound in connection with a preferred material for interconnect 12, will be any one of the five types of adsorption isotherms as classified by Brunauer, which is taught in the publication O. Hougen et al., Chemical Process Principles 2nd Ed., Chapter 10: Adsorption, published by John Wiley and Sons, Inc. (1954).

It is of interest in the present invention that the formation of a passivation layer 32, as seen in FIG. 3, substantially protects upper surface 16 of interconnect 12 from oxidation to a degree wherein the formation of oxide husk 20 and void 22 are substantially eliminated. Passivation layer 32 may be achieved by formation of a chemical compound upon upper surface 16 of interconnect 12 by a chemical reaction with approximately the first 1–1,000 atomic lattice layers of interconnect 12 or it may be achieved by adsorption onto upper surface 16 of interconnect 12 according to any of the aforementioned types as taught by Brunauer.

Preferably, the chemical composition will be a nitrogen-containing chemical compound such as ammonia, $NH_3$. Where interconnect 12 is a tungsten stud, the at least one monolayer reacts to form a tungsten nitride-type composition or adsorbed complex upon the at least one monolayer. Following reaction with the at least one monolayer of upper surface 16 of interconnect 12, formation of ILD layer 18 may be carried out by various methods. One method is deposition by the decomposition of tetra ethyl ortho silicate (TEOS), or by CVD of oxides, nitrides, carbides, and the like.

In order to form ILD layer 18 using lower processing temperatures, it is preferred that a CVD be carried out under plasma-enhanced conditions, i.e., PECVD. According to the inventive method, PECVD temperatures are used in a temperature range from about 100° C. to about 600° C. Preferably, the processing temperature will be in a range from about 150° C. to about 500° C., more preferably from about 200° C. to about 450° C., and most preferably 300° C. to about 400° C.

According to the present invention, a first example is set forth below. Following the formation of dielectric layer 14, as illustrated in FIG. 2, depression 26 such as a contact corridor is formed therein, exposing semiconductor substrate 24 that may be, by way of non-limiting example, a metallization line. Following the exposure of semiconductor substrate 24, a titanium liner layer 28 or the like is formed within depression 26. Subsequently, a titanium nitride layer 30 or the like is formed upon titanium liner layer 28. Titanium nitride layer 30 may be formed by thermal nitridation of a portion of titanium liner layer 28, by deposition of titanium nitride thereupon, or by a combination thereof.

Interconnect 12 is next formed within depression 26. A preferred material for interconnect 12 is tungsten or the like. Tungsten or the like may be formed within depression 26 by CVD, PECVD, or by physical vapor deposition (PVD).

Upper surface 16 as seen in FIG. 3, may be formed by such methods as CMP or an anisotropic etchback that has an etch recipe selectivity that is substantially the same for interconnect 12 as for dielectric layer 14. By "substantially the same", it is meant that selectivity favors leaving dielectric layer 14, and favors it over interconnect 12 in a range from about 1.5:1, preferably about 1.2:1, more preferably 1.1:1, and most preferably 1.05:1.

Passivation of upper surface 16 of interconnect 12 is next carried out by placing semiconductor structure 10 within a tool such as a PECVD chamber and introducing and striking an ammonia plasma or the like therein Treatment temperatures, as set forth above, are imposed upon semiconductor structure 10. The plasma treats upper surface 16 for a time treatment in a range from about 1 to about 60 seconds, preferably from about 5 to about 45 seconds, more preferably from about 20 to about 40 seconds, and most preferably for about 30 seconds.

Figure 4:
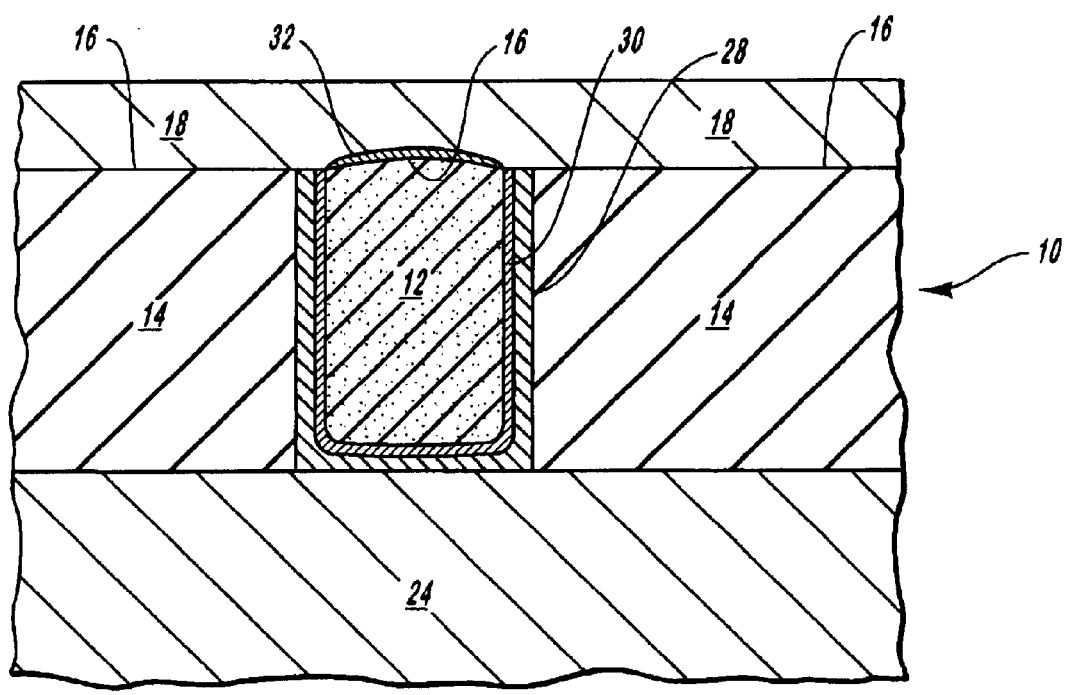
FIG. 4 is an elevational cross-section view of the semiconductor structure depicted in FIG. 3 after further processing, wherein an ILD layer has been formed upon the upper surface according to the inventing methods such that the passivation layer has substantially protected the electrically conductive stud such that oxidation has been substantially resisted.

Formation of ILD layer 18, as illustrated in FIG. 4, may be carried out in a manner that introduces materials to form ILD layer 18 simultaneously with the introduction of the ammonia plasma to create a passivation layer 32 upon upper surface 16 of interconnect 12. Alternatively, after the formation of passivation layer 32 has been substantially accomplished, the deposition tool may be substantially evacuated of the ammonia plasma, and dielectric precursor materials may then be introduced to the deposition tool to form ILD layer 18. Other materials may be used to form passivation layer 32 besides ammonia. For example, diatomic nitrogen or a nitrogen-containing silane may be used. The specific material that may be used will depend upon the particular application.

Next, formation of ILD layer 18 with substantially like materials is carried out under conditions where ILD layer 18 substantially absorbs passivation layer 32 and/or passivation layer 32 is sufficiently thick to resist substantial formation of oxide husk 20. In this embodiment, it is preferred by way of non-limiting example that both passivation layer 32 be formed using $NH_3$ and ILD layer 18 be formed in a deposition by decomposition of TEOS. Other materials, however, may be chosen.

Completion of this example is carried out by the formation of second depression 34 in ILD layer 18. Accordingly, a masking layer is patterned upon upper surface 36 of ILD layer 18 and an anisotropic etch is carried out to form second depression 34. The etch recipe is selective to interconnect 12 as well as titanium liner layer 28, titanium nitride layer 32, and optionally to dielectric layer 14.

Where formation of passivation layer 32 is carried out at least in part by adsorption, and where ammonia is used by way of non-limiting example, an ammonia compound and its derivatives are substantially adsorbed upon upper surface 16 of interconnect 12. By "substantially adsorbed" it is meant that passivation layer 32 does not volatilize during the time required to form ILD layer 18. This means that volatilization is prevented to an extent that passivation layer 32 resists formation of oxide husk 20, or a portion thereof. Of primary interest in the present invention is the achievement of an embodiment whereby passivation layer 32 sufficiently protects upper surface 16 of interconnect 12 such that during the formation of ILD layer 18, ILD layer sufficiently adheres to upper surface 16 of interconnect 12 without causing structural failure as that experienced in the prior art.

Additionally and preferably, any component of passivation layer 32 that volatilizes during formation of ILD layer 18 will be soluble in the materials that form ILD layer 18 such that no immiscible gas bubbles form from volatilized materials of passivation layer 32.

A second example of the inventive method is set forth below. Semiconductor structure 10 includes dielectric layer 14, made of borophosphosilicate glass (BPSG). Dielectric layer 14 rests upon substrate 24. In this example, substrate 24 can be an electrically conductive film that is typically used to wire semiconductive devices.

Following the formation of dielectric layer 14, depression 26 is formed by an anisotropic dry etch that stops on substrate 24. The anisotropic dry etch may include such techniques as ion beam milling or an etch recipe that mobilizes a portion of the masking layer such that the masking layer redeposits upon the sidewalls of depression 26 while it is being formed, thereby forming a substantially anisotropic etch.

Following the formation of depression 26, titanium liner layer 28 is deposited upon dielectric layer 14 and substrate 24 preferably by PECVD. Titanium liner layer 28 is then partially treated in a thermal nitride environment in order to grow titanium nitride layer 30 thereupon. Although titanium nitride layer 30 is grown by thermal combination and conversion of a portion of the titanium in titanium liner layer 28 into titanium nitride layer 30, titanium nitride layer 30 may alternatively be formed by deposition of titanium nitride by such techniques as PVD, PECVD, CVD, and the like.

Following the formation of titanium nitride layer 30, interconnect 12 is formed by deposition of tungsten into depression 26. The deposition of tungsten into depression 26 in order to form interconnect 12 may be facilitated by the presence of titanium nitride layer 30 and titanium liner layer 28. Where the formation of interconnect 12 is formed by force-filling of tungsten into depression 26, the presence of titanium nitride layer 30 and titanium liner layer 28 facilitate slippage of the tungsten material along the region of what will become upper surface 16 and into depression 26 so as to fill depression 26.

Following the filling of depression 26 with tungsten or the like in order to form interconnect 12, all tungsten that is not within depression 26 is removed by a technique such as CMP. Because CMP itself may form oxide husk 20, upper surface 16, particularly that portion of upper surface 16 that comprises interconnect 12, may need to be cleaned by such techniques as an interconnect oxide etch that is selective to dielectric layer 14 and unoxidized portions of interconnect 12.

Following the cleaning of upper surface 16, semiconductor structure 10 is placed within a deposition tool and an ammonia plasma is struck therein. Alternatively, the cleaning of upper surface 16 may be carried out within the same deposition tool where the ammonia plasma is struck. Additionally, the cleaning of upper surface 16 may be carried out within a cluster tool previous to in situ transfer of semiconductor structure 10 into the deposition toot The temperature of semiconductor structure 10 during this stage of the inventive method is in a range substantially the same as in the previous example. Preferably, the treatment time to form passivation layer 32 is less than about 30 seconds. According to this second example, a preferred composition of passivation layer 32 comprises nitrogen that has been adsorbed upon upper surface 16 of interconnect 12 according to Brunauer's Type V adsorption. As a preferred alternative embodiment, upper surface 16 of interconnect 12 is first treated in a nitrogen atmosphere at a temperature sufficient to create tungsten nitride and then under conditions sufficient to create Type V adsorption of several layers of nitrogen compounds upon the tungsten nitride. By several layers of nitrogen compounds, it is understood that the overall composite thickness of passivation layer 32 is about 50 Å, preferably about 20 Å, more preferably about 10 Å, and most preferably about 5 Å.

Another example is set forth below. Processing is carried out as set forth in previous examples. The formation of passivation layer 32 is carried out in situ with the formation of ILD layer 18. After an optional cleaning of upper surface 16, semiconductor structure 10, within a deposition tool, is fed with a mixture of ammonia and silane or the like. At the beginning of this step of the inventive process, the mixture comprises an ammonia rich feed such that initially passivation layer 32 begins to form upon upper surface 16.

The removal of ammonia from the mixture may be carried incrementally. For example, the elimination of ammonia from the mixture may be initiated by decreasing the ammonia portion of the mixture by a preferred percentage of the entire amount of ammonia over a period of time. Specifically, the amount of ammonia may be decreased every five seconds by about 5%, such that after about 100 seconds, the amount of ammonia in the feed mixture is reduced to about zero. Alternatively the amount of ammonia may be decreased every five seconds by 10%, such that after about one minute, the amount of ammonia in the feed mixture is reduced to about zero. Alternatively, the amount of ammonia may be decreased by about 25% every five seconds such that after about twenty seconds, the amount of ammonia in the feed mixture has been reduced to about zero. Additionally, the amount of ammonia may be decreased by 50% every five seconds such that after about ten seconds, the amount of ammonia in the feed mixture is reduced to about zero. Finally, the amount of ammonia in the feed mixture may be reduced to about zero after any five-second time increment to about zero from 100% in a single step.

As an alternative embodiment and in connection with the reduction of the amount of ammonia in the mixture, processing conditions may be altered from conditions that are less likely to cause formation to oxide husk 20 to conditions that are more likely. For example, processing temperatures sufficient to form passivation layer 32 may be initiated with an ammonia-rich mixture under conditions not likely to cause formation of oxide husk 20. As the amount of ammonia in the mixture is reduced, processing temperatures may be increased proportionally under conditions that are more likely to cause formation of oxide husk 20 than under conditions previously established when the amount of ammonia in the mixture is greater. The initial formation of some of passivation layer 32, however, resists the formation of oxide husk 20. Preferably, the processing temperature will be the same as the deposition temperature for ILD layer 18.

Following the formation of passivation layer 32, upper surface 16 is covered with ID layer 18 in situ by a method as set forth above. During the deposition of ILD layer 18, passivation layer 32 protects upper surface 16 of interconnect 12 and prevents the formation of oxide husk 20. As a preferred alternative embodiment of the present invention, the materials comprising passivation layer 32 may react with ILD layer 18 material without causing unwanted oxidation of upper surface 16 of interconnect 12. In this preferred alternative embodiment, the materials comprising passivation layer 32 and ILD layer 18 will interact to form a new compound that will have a lower stress than that of oxide husk 20.

Alternative compositions to ammonia may be used during plasma treatment of upper surface 16 of interconnect 12. For example, nitrogen-containing compositions that are preferred for the inventive method include ammonia, diatomic nitrogen, nitrogen-containing silane, and the like.

FIG. 4 illustrates further processing of semiconductor structure 10 as depicted in FIG. 3. It can be seen that ILD layer 18 has been formed upon upper surface 16 of semiconductor 10 according to the inventive method. The presence of passivation layer 32 has prevented formation on oxide husk according to an object of the invention. It can be appreciated that passivation layer 32 may form exclusively upon interconnect 12 and alternatively onto titanium liner layer 28 and titanium nitride layer 30. This means that passivation layer 32 may not substantially form upon upper surface 16 over dielectric layer due to incompatible reaction chemistry that prevents any type of reactive material to form.

Figure 5:
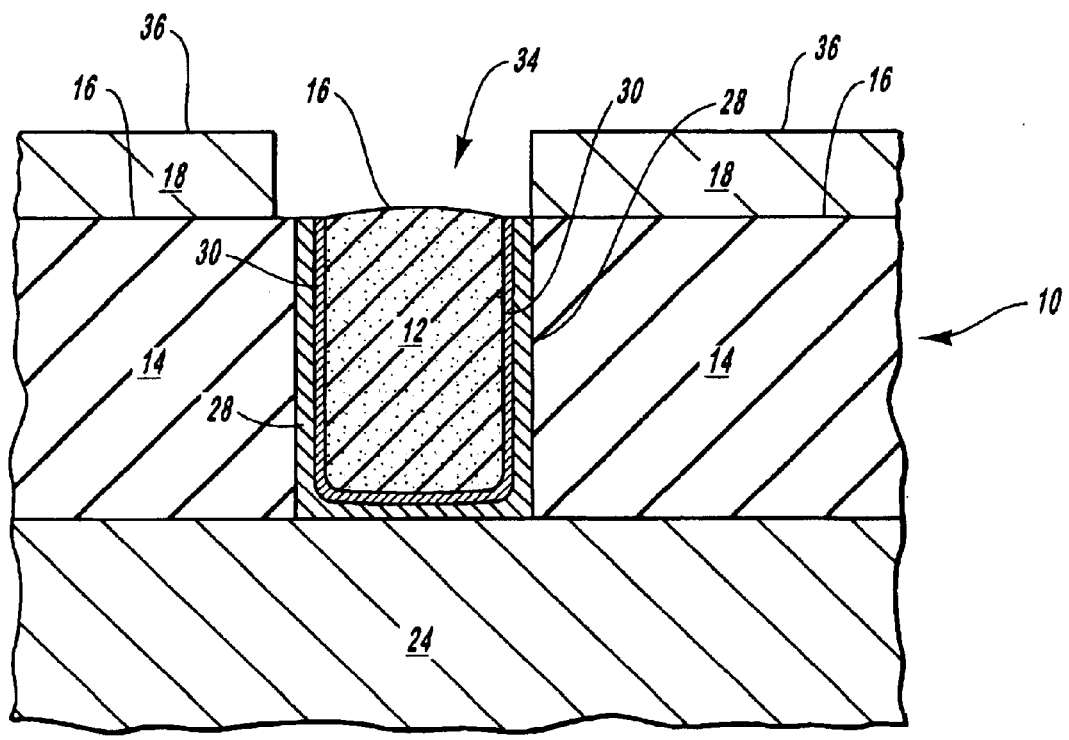
FIG. 5 is an elevational cross-section view of the semiconductor structure depicted in FIG. 4 after further processing, wherein a second depression has been formed into the ILD layer according to damascene technology in order to allow a metallization trench to be formed, or an upper level contact to be electrically connected to the interconnect that is beneath the ILD layer.

Following the formation of ILD layer 18, further processing is carried out as illustrated in FIG. 5. Second depression 34 is formed into ILD layer 18 by patterning and etching thereof. In a damascene process such as that illustrated in FIG. 5, second depression 34 is formed substantially above interconnect 12. Second depression 34 may be, by way of on-limiting example, a wiring trench such that metallization within second depression 34 would run in and out of the plane of FIG. 5. Additionally, second depression 34 may be a contact corridor such that metallization would run left to right, substantially within the plane of FIG. 5 along the upper surface 36 of ILD layer 18 and filled into second depression 34 such that a metallization line with a contact is formed, whereby the contact is in electrical communication with interconnect 12.

The present invention may be embodied in other specific forms without departing from its spirit or essential characteristics. The described embodiments are to be considered in all respects only as illustrative and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming an electrical device including providing a substrate having a first dielectric upper layer; forming a depression in said first dielectric upper layer, filling said depression with an electrically conductive film having an electrical resistivity and an upper surface that is co-planar with the first dielectric upper layer, said method comprising:
   reacting a chemical composition with said upper surface to form a passivating layer over the upper surface, wherein said passivating layer has a thickness of less than about 50 Å, wherein the step of reacting a chemical composition with said upper surface to form a passivating layer comprises:
   exposing the upper surface to a plasma having a first concentration of a chemical composition used to form the passivation layer; and
   incrementally reducing the concentration of the chemical composition until it is completely removed from the presence of the upper surface; and
   forming a second dielectric upper layer over said electrically conductive film and said first dielectric upper layer, wherein:
   at least an exposed surface of the electrically conductive film is unoxidized; and
   said second dielectric upper layer is adhered to said electrically conductive film.

2. The method as defined in claim 1, wherein reacting a chemical composition with said upper surface further comprises:
   providing a nitrogen-containing composition;
   heating said first dielectric upper layer; and
   exposing said upper surface to said nitrogen-containing composition to form a chemical reaction compound having a higher resistance to oxidation than said electrically conductive film.

3. The method as defined in claim 2, wherein the step of hearing said first dielectric upper layer comprises initially heating said first dielectric layer to a first temperature and thereafter heating said first dielectric layer to a second temperature, wherein the first temperature is less favorable to the formation of an oxide husk on said upper surface than the second temperature.

4. The method as defined in claim 1, wherein forming a second dielectric upper layer over said electrically conductive film and said first dielectric upper layer comprises in situ depositing said second dielectric upper layer over said electrically conductive film and said first dielectric upper layer while simultaneously reacting said chemical composition with at least one monolayer of said upper surface.

5. The method as defined in claim 1, wherein forming a second dielectric upper layer over said electrically conductive film and said first dielectric upper layer comprises in situ depositing said second dielectric upper layer over said electrically conductive film and said first dielectric upper layer after reacting said chemical composition with at least one monolayer of said upper surface.

6. A method according to claim 1, wherein said chemical composition comprises nitrogen-containing silane.

7. A method of forming an electrical device including providing a substrate having a first dielectric upper layer; forming a depression in said first dielectric upper layer, filling the depression with an electrically conductive film having an upper surface that is co-planar with the first dielectric upper layer, said method comprising:
   reacting a chemical composition with said upper surface to form a passivation layer having a thickness not greater than about 50 Å upon the upper surface, the step of forming the passivation layer comprising heating said first dielectric upper layer to a first temperature and thereafter heating said first dielectric upper layer to a second temperature, wherein the first temperature is less favorable to the formation of an oxide husk on said dielectric upper layer than the second temperature; and
   forming a second dielectric upper layer over said electrically conductive film and said first dielectric upper layer, wherein:
   at least an exposed surface of the electrically conductive film is unoxidized;
   said second dielectric upper layer is adhered to said electrically conductive film.

8. The method as defined in claim 7, wherein the passivation layer upon the upper surface has a thickness in a range from about 2 Å to about 20 Å.

9. The method as defined in claim 7, wherein reacting said chemical composition comprises forming a passivation layer upon said upper surface that is absorbed onto upper surface.

10. The method as defined in claim 7, wherein said passivation layer is formed by the steps comprising:
   forming a first layer by chemically reacting components of said chemical composition and said upper surface; and
   forming a second layer by adsorbing portions of said chemical composition onto said first layer.

11. A method according to claim 7, wherein said chemical composition comprises nitrogen-containing silane.

12. A method of forming an electrical device, the method comprising:

forming an electrically conductive interconnect disposed within a first dielectric layer, said electrically conductive interconnect having an upper surface;

forming a first passivation layer by reacting a chemical composition with from about 1 to about 1,000 atomic lattice layers of said upper surface, said passivation layer disposed upon said upper surface and having a thickness of less than about 50 Å, said first passivation layer including chemical reaction products and solid solution mixtures between said electrically conductive interconnect and a chemical compound, the step of forming the passivation layer comprising:

exposing the upper surface to a plasma having a first concentration of a chemical composition used to form the passivation layer; and incrementally reducing the concentration of the chemical composition until it is completely removed from the presence of the upper surface; and forming an ILD disposed upon said first dielectric layer and upon said upper surface, said ILD being continuously adhered to said upper surface.

13. The method as defined in claim 12, wherein forming said electrically conductive interconnect further comprises:

forming a first titanium liner layer within a depression in said first dielectric layer;

forming a first titanium nitride layer upon said first titanium liner layer; and forming a tungsten film upon said first titanium nitride layer so as to fill the depression.

14. The method as defined in claim 12, wherein forming said first passivation layer further comprises forming a first tungsten nitride layer upon said upper surface, wherein said first tungsten nitride layer has a thickness of less than about 50 Å.

15. The method as defined in claim 12, further comprising forming a second passivation layer comprising ammonia and its derivatives that is adsorbed upon said first passivation layer, wherein said first passivation layer comprises a tungsten nitride compound.

16. The method as defined in claim 12, wherein said first passivation layer comprises a layer upon said upper surface comprising ammonia and its derivatives that is adsorbed upon said upper surface.

17. A method of forming an electrical device, the method comprising:

forming an electrically conductive interconnect disposed within a dielectric layer, said electrically conductive interconnect having an upper surface, and further including the steps of:

forming a titanium liner layer disposed within a depression in said dielectric layer;

forming a titanium nitride layer disposed upon said titanium liner layer; and forming a tungsten film disposed upon said titanium nitride layer and filling said depression;

in situ forming:

a passivation layer composed of tungsten nitride, disposed upon said upper surface, and having a thickness of less than about 50 Å, wherein the step of forming the passivation layer comprises heating said first dielectric layer to a first temperature and thereafter heating said first dielectric layer to a second temperature, wherein the first temperature is less favorable to the formation of an oxide husk on said upper surface than the second temperature; and an ILD disposed upon said dielectric layer and upon said upper surface, said ILD being continuously adhered to said upper surface.

18. A method of forming an electrical device, the method comprising:

forming an electrically conductive interconnect having an upper surface and being disposed within a dielectric layer, and further including the steps of:

forming a titanium liner layer disposed within a depression in said dielectric layer;

forming a titanium nitride layer disposed upon said titanium liner layer; and forming a tungsten film disposed upon said titanium nitride layer and filling said depression;

forming first and second passivation layers by protecting from about 1 to about 1,000 atomic lattice layers of said upper surface, said first and second passivation layers comprising:

a first passivation layer comprising a tungsten nitride compound and being disposed upon said upper surface;

a second passivation layer comprising ammonia and its derivatives that is adsorbed upon said first passivation layer; and forming an ILD disposed upon said dielectric layer and upon said upper surface, said ILD being continuously adhered to said upper surface.

19. A method of forming an electrical device, the method comprising:

forming an electrically conductive interconnect disposed within a dielectric layer, said electrically conductive interconnect having an upper surface, and further including the steps of:

forming a titanium liner layer disposed within a depression in said dielectric layer;

forming a titanium nitride layer disposed upon said titanium liner layer; and forming a tungsten film disposed upon said titanium nitride layer and filling said depression;

forming a passivation layer disposed upon said upper surface comprising ammonia and its derivatives that are adsorbed upon said upper surface, wherein:

the step of forming the passivation layer comprises heating said first dielectric layer to a first temperature and thereafter heating said first dielectric layer to a second temperature, wherein the first temperature is less favorable to the formation of an oxide husk on said upper surface than the second temperature; and the step of forming the passivation layer further comprises:

exposing the upper surface to a plasma having a first concentration of a chemical composition used to form the passivation layer; and incrementally reducing the concentration of the chemical composition until it is completely removed from the presence of the upper surface; and forming an ILD disposed upon said dielectric layer and upon said upper surface, said ILD being continuously adhered to said upper surface.

20. A method of forming an interconnect in an electronic device, the method comprising:

forming a metallic structure disposed within a first silicon oxide layer, said metallic structure having an upper surface;

forming a passivation layer disposed upon said upper surface, said passivation layer including chemical reaction products and solid solution mixtures between said metallic structure and a chemical compound, wherein:
the step of forming the passivation layer comprises heating said first dielectric layer to a first temperature and thereafter heating said first dielectric layer to a second temperature, wherein the first temperature is less favorable to the formation of an oxide husk on said upper surface than the second temperature; and
the step of forming the passivation layer further comprises:
exposing the upper surface to a plasma having a first concentration of a chemical composition used to form the passivation layer; and
incrementally reducing the concentration of the chemical composition until it is completely removed from the presence of the upper surface; and; and
forming a second silicon oxide layer disposed upon said first silicon oxide layer and upon said upper surface, said second silicon oxide layer being continuously adhered to said upper surface.

21. The method as defined in claim 20, wherein:
said passivation layer further comprises forming a tungsten nitride layer disposed upon said upper surface; and
said tungsten nitride layer having a thickness of less than about 50 Å.

22. The method as defined in claim 20, further comprising forming a second layer comprising ammonia and its derivatives that is adsorbed upon said passivation layer, wherein said passivation layer comprises a tungsten nitride compound.

23. The method as defined in claim 20, wherein said passivation layer comprises a layer upon said upper surface comprising ammonia and its derivatives that is adsorbed upon said upper surface.

24. A method of forming an interconnect in an electronic device, the method comprising:
forming a metallic structure disposed within a first silicon oxide layer, said metallic structure having an upper surface, and further including the steps of:
forming a titanium liner layer disposed within an interconnect corridor in said first silicon oxide layer;
forming a titanium nitride layer disposed upon said titanium liner layer; and
forming a tungsten film disposed upon said titanium nitride layer;
forming a passivation layer composed of tungsten nitride, having a thickness of less than about 50 Å, and being disposed upon said upper surface, the step of forming the passivation layer comprising:
exposing the upper surface to a plasma having a first concentration of a chemical composition used to form the passivation layer; and
incrementally reducing the concentration of the chemical composition until it is completely removed from the presence of the upper surface; and
forming a second silicon oxide layer disposed upon said first silicon oxide layer and upon said upper surface, said second silicon oxide layer being continuously adhered to said upper surface.

25. A method according to claim 24, wherein the step of incrementally reducing the concentration of the chemical composition comprises reducing the concentration of the chemical composition by a selected percentage at regular intervals until the concentration equal is about zero.

26. A method of forming an interconnect in an electronic device, the method comprising:
forming a metallic structure disposed within a first silicon oxide layer, said metallic structure having an upper surface, and further including the steps of:
forming a titanium liner layer disposed within an interconnect corridor in said first silicon oxide layer;
forming a titanium nitride layer disposed upon said titanium liner layer; and
forming a tungsten film disposed upon said titanium nitride layer;
forming first and second passivation layers to chemically protect from said upper surface, the step of forming the first and second passivation layers comprising heating said first silicon oxide layer to a first temperature and thereafter heating said first silicon oxide layer to a second temperature, wherein the first temperature is less favorable to the formation of an oxide husk on said upper surface than the second temperature, the first and second passivation layers comprising:
a first passivation layer disposed upon said upper surface and composed of a tungsten nitride compound; and
a second passivation layer comprising ammonia and its derivatives that is adsorbed upon said first passivation layer; and
forming a second silicon oxide layer disposed upon said first silicon oxide layer and upon said upper surface, said second silicon oxide layer being continuously adhered to said upper surface.

27. A method of forming an interconnect in an electronic device, the method comprising:
forming a metallic structure disposed within a first silicon oxide layer, said metallic structure having an upper surface, and further including the steps of:
forming a titanium liner layer disposed within an interconnect corridor in said first silicon oxide layer;
forming a titanium nitride layer disposed upon said titanium liner layer; and
forming a tungsten film disposed upon said titanium nitride layer;
forming a passivation layer disposed upon said upper surface and composed of ammonia and its derivatives that is adsorbed upon said upper surface, the step of forming the passivation layer comprising:
exposing the upper surface to a plasma having a first concentration of a chemical composition used to form the passivation layer; and
incrementally reducing the concentration of the chemical composition until it is completely removed from the presence of the upper surface; and
forming a second silicon oxide layer disposed upon said first silicon oxide layer and upon said upper surface, said second silicon oxide layer being continuously adhered to said upper surface.

* * * * *

UNITED STATES PATENT AND TRADEMARK OFFICE
CERTIFICATE OF CORRECTION

PATENT NO. : 6,790,762 B1
DATED : September 14, 2004
INVENTOR(S) : Zhiping Yin and Mark Jost It is certified that error appears in the above-identified patent and that said Letters Patent is hereby corrected as shown below:

Title page,
Item [57], ABSTRACT, replace the entire ABSTRACT with
-- The present invention relates to the formation of an ILD layer while preventing of reducing oxidation of the upper surface of a metallic interconnect. Avoidance of oxidation of the upper surface of a metallic interconnect is achieved according to the present invention by passivating the exposed upper surface of the metallic interconnect prior to formation of the ILD. In order to avoid the oxidation of an upper surface of the interconnect during the formation of an ILD layer, an *in situ* passivation of the upper surface of the interconnect, immediately prior to or simultaneously with the formation of the ILD layer avoids the problems of the prior art. --

Column 2,
Line 8, before "can range" insert -- 20 --

Column 4,
Line 2, change "inventing" to -- inventive --
Line 48, after "14" change "is" to -- are --
Line 57, after "thereof" insert -- . --

Column 7,
Line 50, after "deposition" change "toot" to -- tool. --

Column 8,
Line 10, after "carried" insert -- out --
Line 49, change "ID" to -- ILD --

Column 9,
Line 9, after "layer" insert -- 14 --
Line 18, change "on-limiting" to -- non-limiting --

Column 10,
Line 56, change "absorbed onto" to -- adsorbed onto said --

Column 11,
Line 62, change "beating" to -- heating --

UNITED STATES PATENT AND TRADEMARK OFFICE
CERTIFICATE OF CORRECTION

PATENT NO. : 6,790,762 B1
DATED : September 14, 2004
INVENTOR(S) : Zhiping Yin and Mark Jost It is certified that error appears in the above-identified patent and that said Letters Patent is hereby corrected as shown below:

Column 13,
Line 17, remove "and;"

Signed and Sealed this

Ninth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,790,762 B1
DATED : September 14, 2004
INVENTOR(S) : Zhiping Yin and Mark Jost It is certified that error appears in the above-identified patent and that said Letters Patent is hereby corrected as shown below:

<u>Title page,</u>
Item [57], ABSTRACT, replace entire abstract with
-- The present invention relates to the formation of an ILD layer while preventing of reducing oxidation of the upper surface of a metallic interconnect. Avoidance of oxidation of the upper surface of a metallic interconnect is achieved according to the present invention by passivating the exposed upper surface of the metallic interconnect prior to formation of the ILD. In order to avoid the oxidation of an upper surface of the interconnect during the formation of an ILD layer, an *in situ* passivation of the upper surface of the interconnect, immediately prior to or simultaneously with the formation of the ILD layer avoids the problems of the prior art. --.

<u>Column 2,</u>
Line 8, before "can range" insert -- 20 --.

<u>Column 4,</u>
Line 2, change "inventing" to -- inventive --.
Line 48, after "14" change "is" to -- are --.
Line 57, after "thereof" insert -- . --.

<u>Column 7,</u>
Line 50, after "deposition" change "toot" to -- tool. --.

<u>Column 8,</u>
Line 10, after "carried" insert -- out --.
Line 49, change "ID" to -- ILD --.

<u>Column 9,</u>
Line 9, after "layer" insert -- 14 --.
Line 18, change "on-limiting" to -- non-limiting --.

<u>Column 10,</u>
Line 56, change "absorbed onto" to -- adsorbed onto said --.

UNITED STATES PATENT AND TRADEMARK OFFICE
CERTIFICATE OF CORRECTION

PATENT NO.   : 6,790,762 B1
DATED        : September 14, 2004
INVENTOR(S)  : Zhiping Yin and Mark Jost It is certified that error appears in the above-identified patent and that said Letters Patent is hereby corrected as shown below:

<u>Column 11,</u>
Line 62, change "beating" to -- heating --.

<u>Column 13,</u>
Line 17, remove "and;".

Signed and Sealed this

Thirtieth Day of August, 2005

JON W. DUDAS
*Director of the United States Patent and Trademark Office*